US008105104B2

(12) United States Patent
Chen et al.

(10) Patent No.: US 8,105,104 B2
(45) Date of Patent: Jan. 31, 2012

(54) SOCKET HAVING LATCH DEVICE WITH ROTATABLE PRESSING PAD

(75) Inventors: Ke-Hao Chen, Tu-Cheng (TW); Hsiu-Yuan Hsu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/753,119

(22) Filed: Apr. 2, 2010

(65) Prior Publication Data

US 2010/0255707 A1    Oct. 7, 2010

(30) Foreign Application Priority Data

Apr. 3, 2009  (TW) .................................. 98205416

(51) Int. Cl.
*H01R 13/62*    (2006.01)
(52) U.S. Cl. ...................................................... 439/331
(58) Field of Classification Search .................. 439/330, 439/331
See application file for complete search history.

(56) References Cited

U.S. PATENT DOCUMENTS 6,162,066 A * 12/2000 Glick et al. ..................... 439/73
2008/0293285 A1  11/2008 Hsieh
* cited by examiner

*Primary Examiner* — Ross Gushi
(74) *Attorney, Agent, or Firm* — Andrew C. Cheng; Wei Te Chung; Ming Chieh Chang

(57) ABSTRACT

A socket comprises an insulative base, a movable frame assembled to the insulative base, and at least one latch device pivotally assembled to the insulative base. The movable frame can move up and down relative to the insulative base. Each latch device includes a latching member pivotally assembled to the movable frame and a pressing pad linked to the latching member. The pressing pad can be able to rotate freely relative to the latching member when the movable frame actuates the latch device to rotate.

16 Claims, 6 Drawing Sheets

SOCKET HAVING LATCH DEVICE WITH ROTATABLE PRESSING PAD

BACKGROUND OF THE INVENTION

1. Field of the Invention

The present invention relates to an electrical connector, and more particularly to a burn-in socket having latching members with a plurality of pressing pads which can rotate freely when the latching members of the burn-in socket rotates.

2. Description of the Related Art

Conventionally, a burn-in socket is used to mount an IC package for various testing, in which IC package is loaded into or loaded out frequently for connecting or disconnecting with terminals electrically therein. U.S. Patent Application Publication No. 20080293285 submitted by HSIEH and published on Nov. 27, 2008, discloses a typical burn-in socket for interconnecting an IC package and a test board. The burn-in socket includes a base, an actuating device assembled on said base, a frame retained on said base, a plurality of contacts received in said base and a plurality of switch members pivotally assembled on said base. Said actuated device includes a plurality of metal sustaining shafts with a plurality of rollers ringed thereon. Said switch member further includes a plurality of rotating shafts retained on said base and a plurality of latching members, the latching member is urged by said rotating shafts to rotate between an opened position and a locked position.

However, in the conventional burn-in socket, each latching member has a pressing portion and a horizontal locking portion extending inwardly from said pressing portion. The horizontal locking portion has a pressing bar protruding downwardly on an end thereof for pressing the semiconductor package. When the latching members rotate to the locking position, only the pressing bars of the latching members engage with the semiconductor package received in the burn-in socket. So the contacting area between the pressing bar of the latching members and the semiconductor package is comparably small. As a result the pressing bars of the latching members of the socket would leave marks on a top surface of the semiconductor package after a high temperature test. So the semiconductor package is easily damaged in the test process when the semiconductor is assembled and locked in the socket.

Hence, an improved burn-in socket is required to overcome the disadvantages of the prior art.

SUMMARY OF THE INVENTION

An object of the invention is to provide a socket, which has a latch device with a pressing pad which can self-rotate freely when the latch device is actuated by a movable frame to rotate from an opened position and a closed position.

To achieve the above-mentioned object, a socket comprises an insulative base, a movable frame assembled to the insulative base, and at least one latch device pivotally assembled to the insulative base. The movable frame can move up and down relative to the insulative base. Each latch device includes a latching member pivotally assembled to the movable frame and a pressing pad linked to the latching member. The pressing pad can rotate freely relative to the latching member when the movable frame actuates the latch device to rotate.

Other features and advantages of the present invention will become more apparent to those skilled in the art upon examination of the following drawings and detailed description of preferred embodiments, in which:

DETAILED DESCRIPTION OF PREFERRED EMBODIMENT

The present invention shall be discussed hereinafter in terms of a preferred embodiment illustrated in the accompanying drawings. In the following description, numerous specific details are set forth in order for the reader hereof to gain a thorough understanding of the present invention. It will be obvious, however, to those skilled in the art that certain well-know elements may not be shown in detail in order to unnecessarily obscure the present invention.

Figure 1:
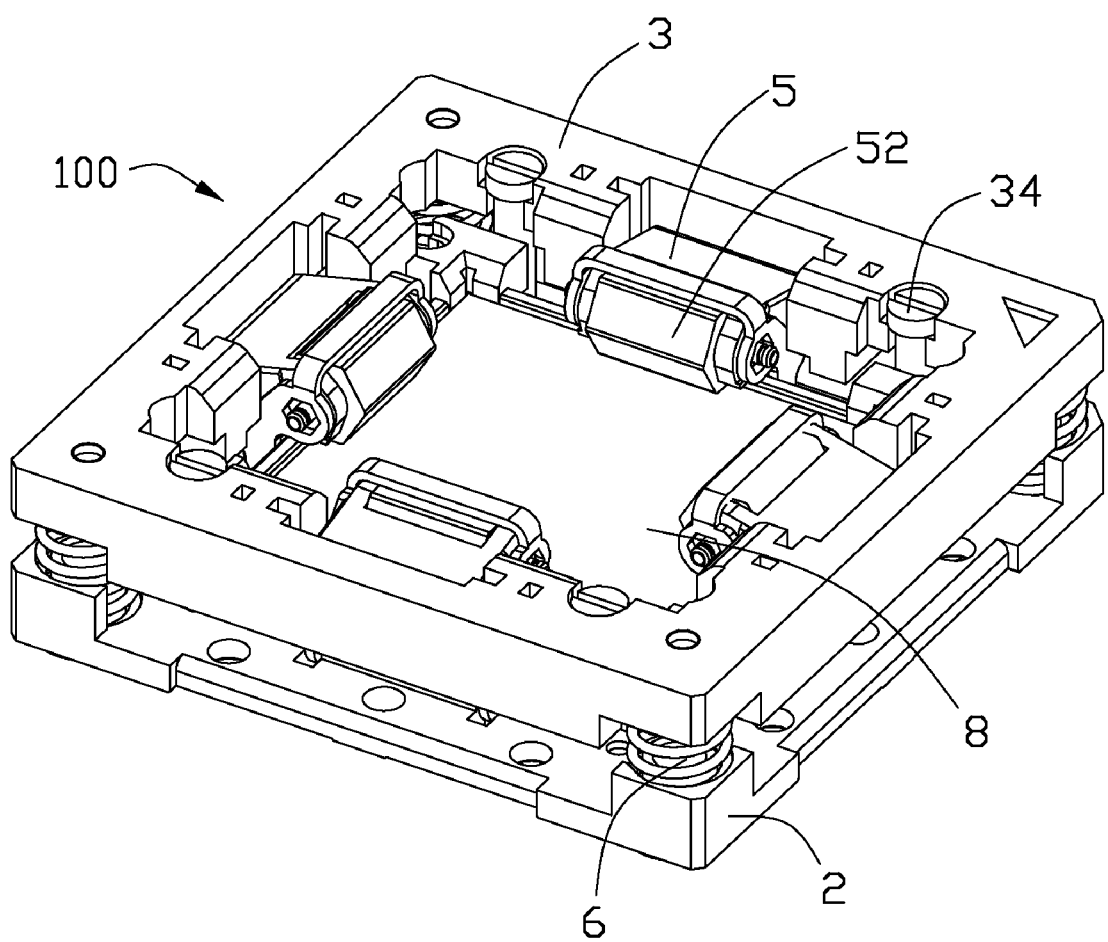
FIG. 1 is an assembled, perspective view of a socket in accordance with a preferred embodiment of the present invention, showing the socket located at a closed position and locking a semiconductor package in a final state.
Figure 2:
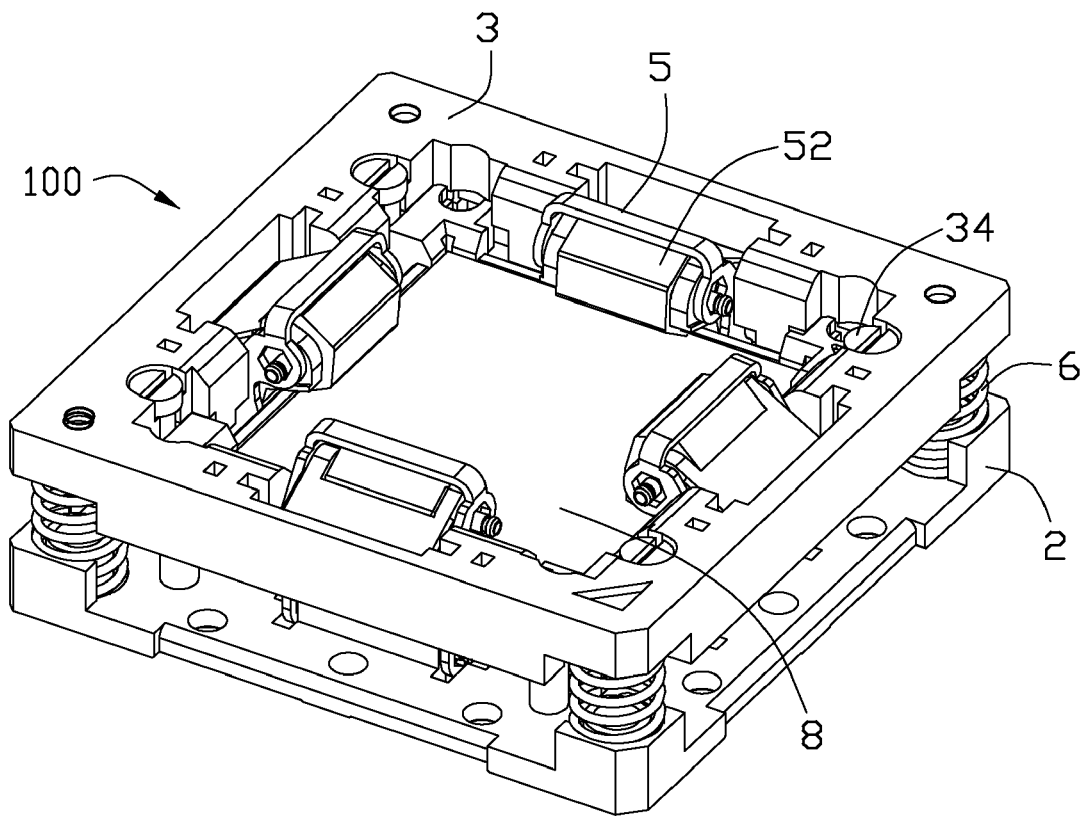
FIG. 2 is another assembled, perspective view of the socket in FIG. 1, showing a plurality of latch devices of the socket located at a half-opened position and pressing the semiconductor package in an initial state.

Referring to FIGS. 1-2, a burn-in socket 100 in accordance with the preferred embodiment of the present invention is adapted to electrically connect a semiconductor package 8 to a printed circuit board (not shown). Conjoined with FIG. 3, the burn-in socket 100 includes an insulative base 2, a supporting board 4 assembled on the insulative base 2, a movable frame 3 located above the supporting board 4 and mounted on the insulative base 2 by four first bolts 34, and four latch devices 5 respectively assembled to the insulative base 2 for locking the semiconductor 8. The movable frame 3 can be operated between an upper position and a lower position to drive the latch devices 5 to rotate between an opened position and a closed position. A plurality of first springs 6 are retained on four corners of the insulative base 2 and located between the movable frame 3 and the insulative base 2 for sustaining movement of the movable frame 3 between the upper position and the lower position.

Figure 3:
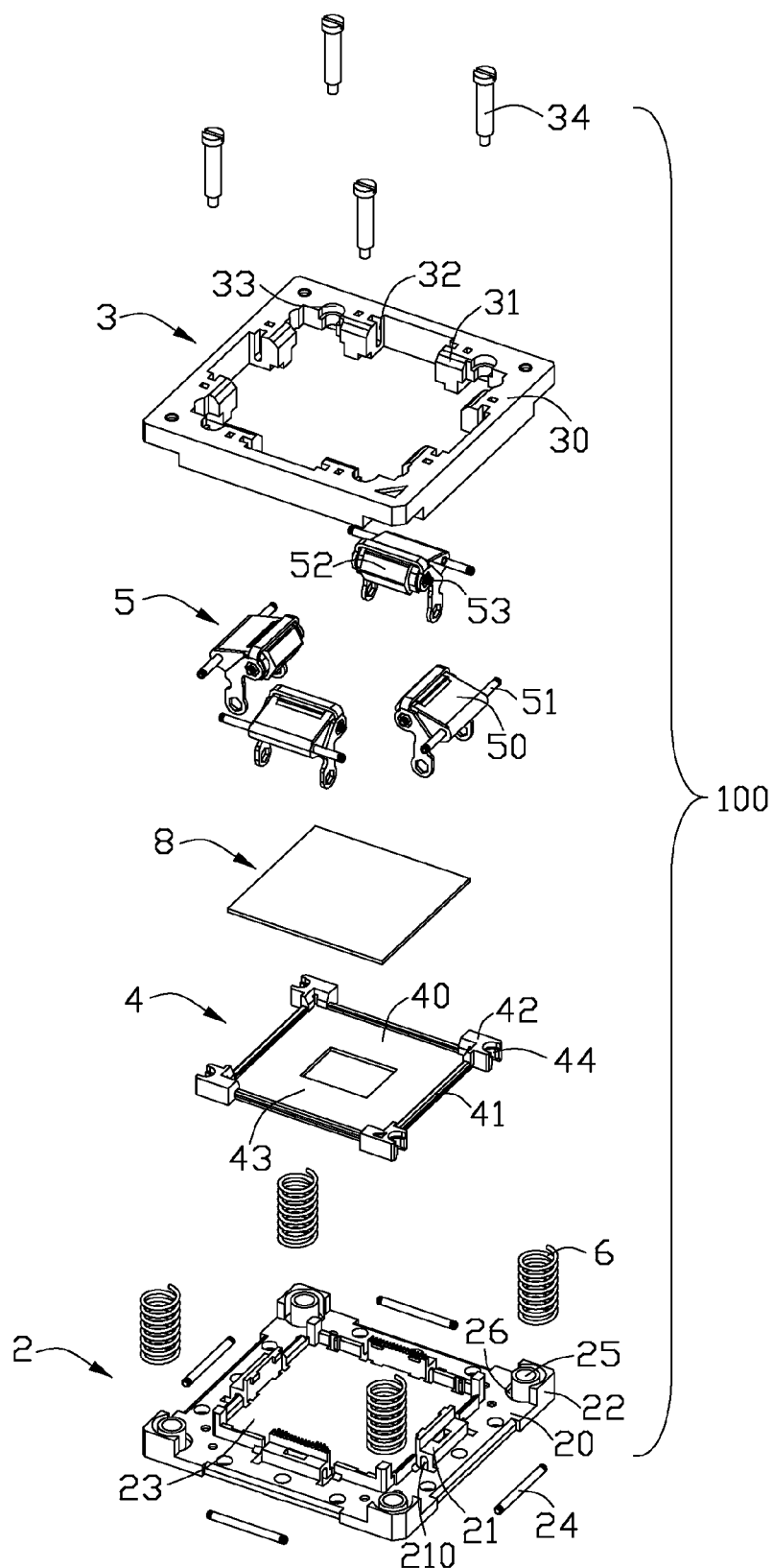
FIG. 3 is an exploded, perspective view of the socket in FIG. 1.

Referring to FIG. 3, the insulative base 2 has a rectangular shape main body 20 defining a quadrate opening 23. The insulative base 2 has four mounting portions 21 disposed on the main body 20 around four edges of the opening 23, and four securing portions 22 extending upwardly from a top surface of the main body 20 at four corners thereof. Each mounting portion 21 defines a through hole 210 for a haulm 24 passing through to pivotally assemble the latch device 5 to the insulative base 2.

The movable frame 3 is a rectangular frame and has four sidewalls 30. The movable frame 3 has a pair of protruding seats 31 extending inwardly from inner edge of each sidewall 30. Each protruding seat 31 defines a horizontal shaft slot 32 opening upwardly for receiving a first sustaining shaft 51 of the latch device 5. Four U-shaped guiding slots 33 are recessed outwardly from two opposed inner side surfaces of the sidewalls 30 near inner corners of the movable frame 3 for engaging with the first bolts 34.

The supporting board 4 has a rectangular base portion 40 and four walls 41 extending upwardly and surrounding the base portion 40. The base portion 40 and together with the four walls 41 form a receiving room 43 for receiving the semiconductor package 8. Four L-shaped blockings 42 extend upwardly at four corners of the base portion 40. The blocking 42 is higher than the wall 41. Each blocking 42 defines a longitudinal securing hole 44 for the first bolts 34 passing through to retain the supporting board 4 on the insulative base 2.

Figure 4:
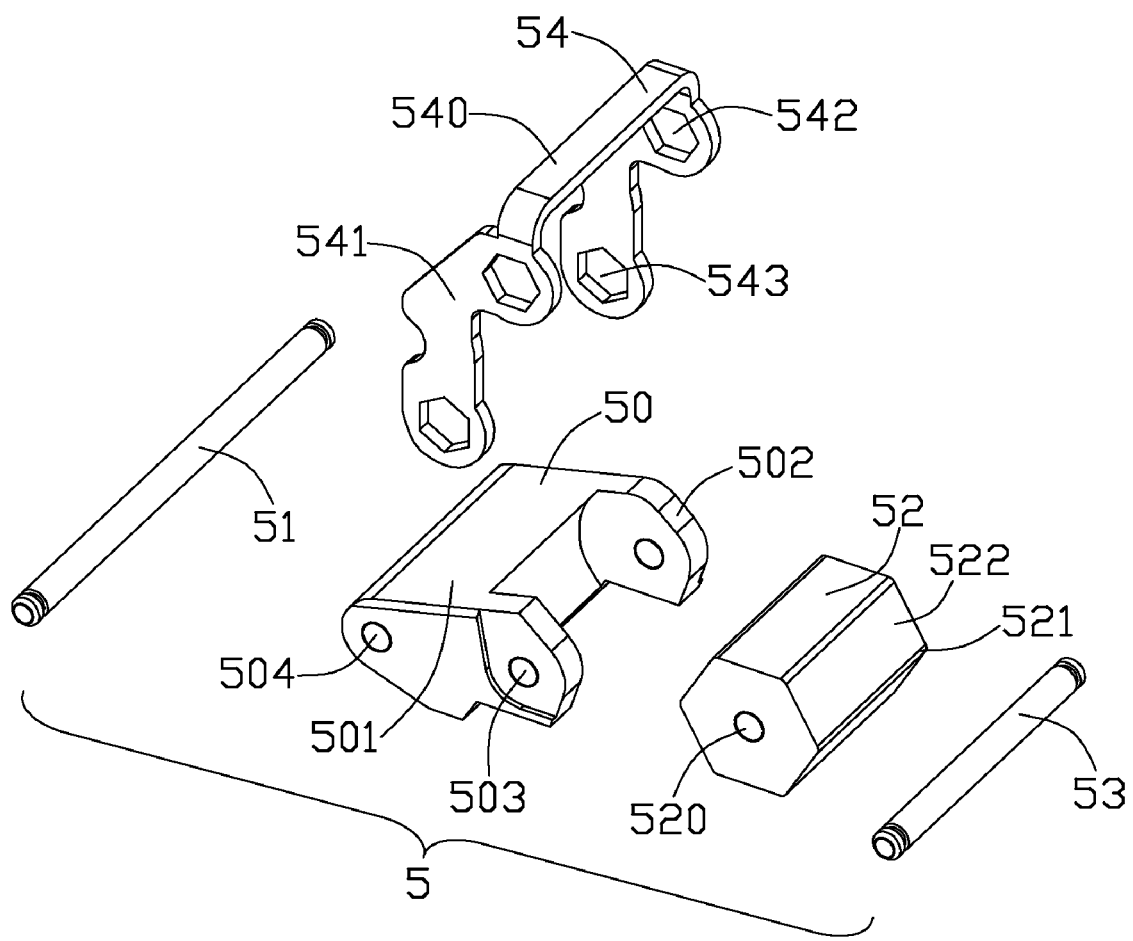
FIG. 4 is an exploded, perspective view of the latch device of the socket.

Referring to FIGS. 3 and 4, each latch device 5 includes a latching member 50, a pressing pad 52 linked to the latching member 50, and a metal connecting bracket 54 disposed surrounding the latching member 50 for assembling the latch device 5 to the insulative base 2. The latching member 50 includes a sustaining portion 501 and a pair of connecting portions 502 extending forwardly from two sides of a front end of the sustaining portion 501. The latching member 50 defines a first shaft hole 504 horizontally extending through a rear end of the sustaining portion 501 for receiving the first sustaining shaft 51. The two connecting portions 502 are parallel to each other and define a pair of second shaft holes 503 for a second sustaining shaft 53 passing through.

The pressing pad 52 is substantially horizontal hexagonal prism. The pressing pad 52 is disposed between the two connecting portions 502. The pressing pad 52 defines a centre hole 520 for the second sustaining shaft 53 passing through so as to link the pressing pad 52 to the two connecting portions 502. The connecting bracket 54 comprises a pair of securing arms 541 parallel to each other and a horizontal bar 540 connecting the two securing arms 541. Each securing arm 541 defines a first fixing hole 542 at a top end thereof corresponding to the second shaft holes 503 for the second sustaining shaft 53 passing through. Thus, the latching member 50 and the pressing pad 52 are pivotally assembled to the connecting bracket 54 by the second sustaining shaft 53. Each securing arm 541 further defines a second fixing hole 543 at a bottom end thereof for the haulm 24 passing through to pivotally assemble the connecting bracket 54 to the insulative base 2.

When using, the movable frame 3 is actuated by a pressing equipment, the movable frame 3 together with the first sustaining shaft 51 downwardly moves, simultaneity, the first springs 6 located between the movable frame 3 and the insulative base 2 are compressed, a plurality of second springs (not shown) assembled to the haulm 24 on the insulative base 2 will force the latch device 5 to rotate around the haulm 24 to the opened position. Then the semiconductor package 8 is put into the receiving room 43 of the supporting board 4. When the pressing equipment does not provide apply force, the first springs 6 will restore to its original state, so the movable frame 3 is moved upwardly by the first springs 6, during this process, the first sustaining shaft 51 will move upwardly following the movement of the movable frame 3, and the movable frame 3 will rotate to the closed position and latch with the semiconductor package 8 in the socket 100.

Figure 5:
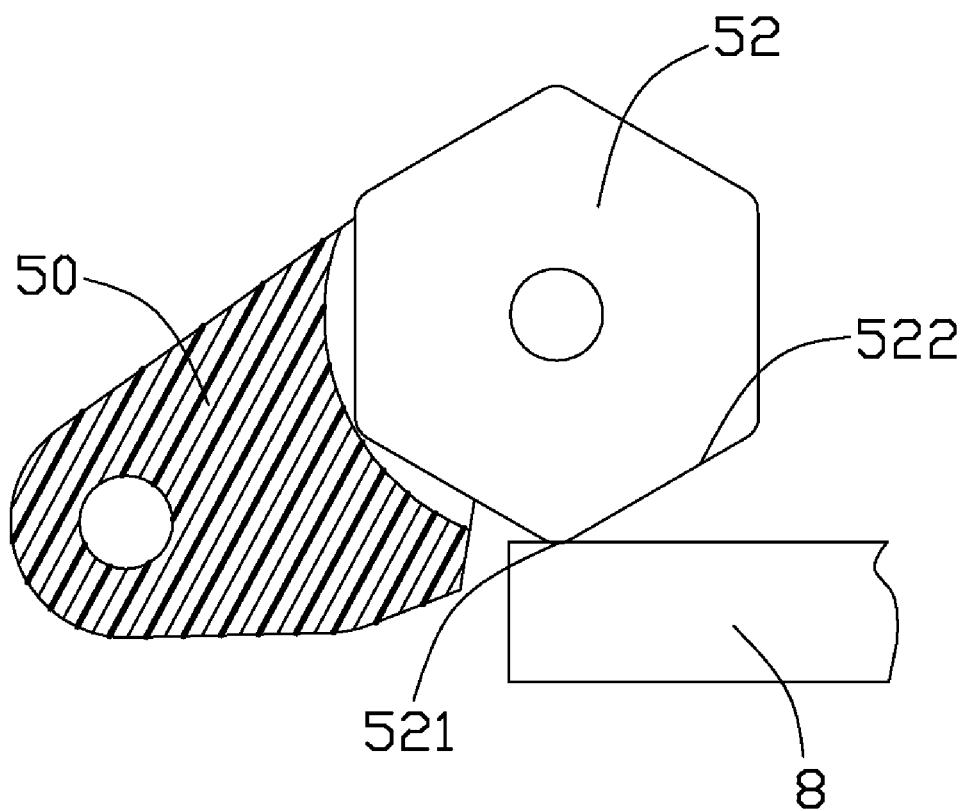
FIG. 5 is a cross-sectional view of the latch device primarily pressing the semiconductor package in the initial state.
Figure 6:
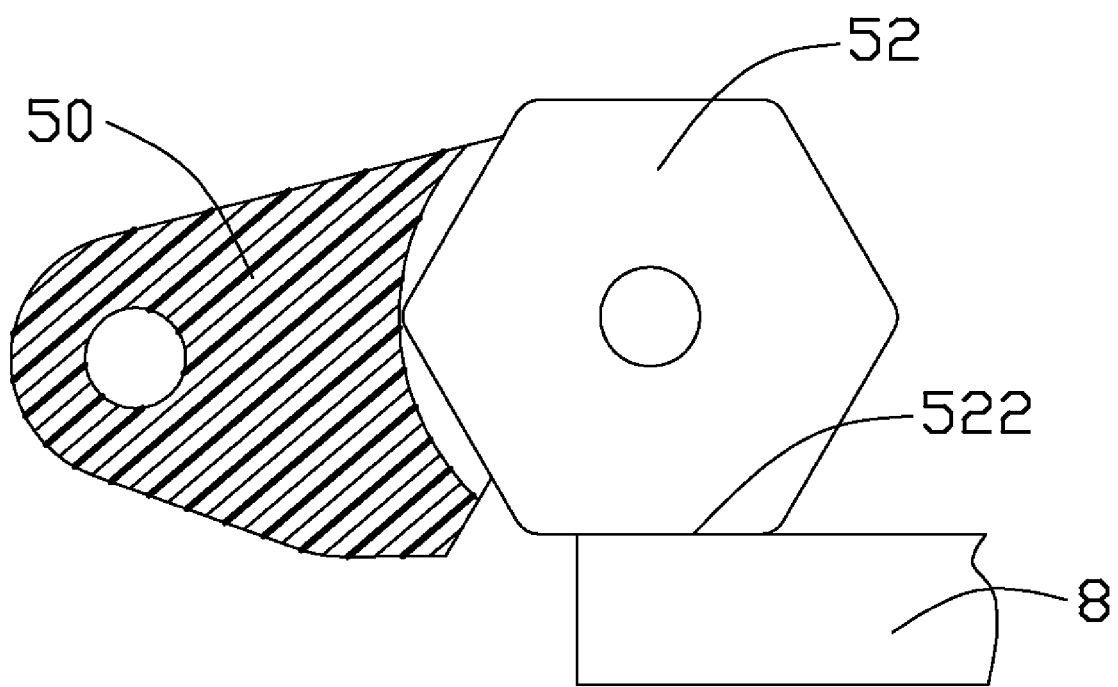
FIG. 6 is a cross-sectional view of the latch device finally pressing the semiconductor package in the final state.

Referring to FIGS. 5 and 6, when the pressing pad 52 of the latch device 5 presses the semiconductor package 8 at an initial state, there is only a seamed edge 521 of a facet 522 of the pressing pad 52 contacts the semiconductor package 8. And when the latch device 5 continues to rotate downwardly, the pressing pad 52 can self-rotate freely around the second sustaining shaft 53 and contact the semiconductor package 8 by the whole facet 522 at a final state when the latch device 5 rotates to the closed position. The pressing pad 52 can keep a large touching area with the semiconductor package 8. So it can get a steady face-touching and reduce contacting force between the latch device 5 and the semiconductor package 8 so as to avoid destroying the semiconductor package 8.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
    an insulative base;
    a movable frame assembled to the insulative base and moving up and down relative to the insulative base;
    at least one latch device pivotally assembled to the insulative base, each latch device including a latching member pivotally assembled to the movable frame and a pressing pad linked to the latching member, wherein
    the pressing pad rotates relative to the latching member when the movable frame actuates the latch device to rotate; wherein
    the latching member includes a sustaining portion and a pair of connecting portions extending forwardly from two ends of a front side of the sustaining portion, the pressing pad is pivotally assembled to the connecting portions; the pressing pad defines a centre hole; and the two connecting portions of the latching member define a pair of second shaft holes corresponding to the centre hole, and a second sustaining shaft passes through the second shaft holes and the centre hole so as to link the pressing pad to the two connecting portions of the latching member.

2. The socket as claimed in claim 1, wherein the latching member defines a first shaft hole horizontally extending through a rear end of the sustaining portion for a first sustaining shaft passing through to pivotally assemble the latching member to the movable frame.

3. The socket as claimed in claim 2, wherein the movable frame has four sidewalls and a plurality of protruding seats extending inwardly from inner edge of the sidewalls.

4. The socket as claimed in claim 3, wherein each protruding seat defines a horizontal shaft slot opening upwardly for receiving the first sustaining shaft.

5. The socket as claimed in claim 4, wherein the latch device further includes a connecting bracket disposed around the latching member.

6. The socket as claimed in claim 5, wherein the connecting bracket comprises a pair of securing arms parallel to each other and a horizontal bar connecting the two securing arms.

7. The socket as claimed in claim 6, wherein each securing arm defines a first fixing hole at a top end thereof corresponding to the second shaft hole of the latching member and a second fixing hole at a bottom end thereof for a haulm passing through to assemble the latch device to the insulative base.

8. A burn-in socket for receiving a semiconductor package comprising:
    an insulative base;
    a movable frame moving up and down relative to the insulative base in a vertical direction;
    at least one latch device pivotally mounted on the insulative base and actuated by the movable frame to rotate from an opened position to a closed position, wherein
    each latch device comprises a pressing pad which can self-rotate freely during the movement of the latch device so as to make a flat facet of the pressing pad contacting with the semiconductor; wherein each latch device further includes a latching member and a connecting bracket disposed surrounding the latching member.

9. The burn-in socket as claimed in claim 8, wherein the latching member includes a sustaining portion and a pair of connecting portions extending forwardly from two sides of a front side of the sustaining portion.

10. The burn-in socket as claimed in claim 9, wherein the pressing pad is linked to the two connecting portions by a second sustaining shaft.

11. The burn-in socket as claimed in claim 9, wherein the latching member defines a horizontal first shaft hole at a rear end of the sustaining portion for a first sustaining shaft passing through so as to assemble the latching member to the movable frame.

12. The burn-in socket as claimed in claim 11, wherein the movable frame has four sidewalls and a plurality of protruding seats extending inwardly from inner edge of the sidewalls, each protruding seat defines a horizontal shaft slot opening upwardly for receiving the first sustaining shaft.

13. A socket for use with an electronic package, comprising:

an insulative base;
a movable frame assembled to the insulative base and being movable up and down relative to the insulative base;
at least one latch device pivotally assembled to the insulative base, each latch device including a latching member defining one end pivotally assembled to the frame about a first shaft and the other end pivotally assembled, about a second shaft opposite to the first shaft, to a pivotal bar which is pivotally mounted to the base, and a pressing pad freely pivotally linked to the latching member about said second shaft; wherein
a circumferential surface of the pressing pad includes a plurality of planar sectors so as to assure a larger engagement with the electronic package via self-adjustment by rotation about the second shaft.

14. The socket as claimed in claim 13, wherein a cross-section of said pressing pad is a polygon.

15. The socket as claimed in claim 14, wherein a number of sides of said polygon is not less than five.

16. The socket as claimed in claim 15, wherein the number is six.

* * * * *